United States Patent
Nikunen et al.

(10) Patent No.: US 9,779,342 B2
(45) Date of Patent: Oct. 3, 2017

(54) RFID READING METHOD AND RFID READER

(71) Applicant: METSO FLOW CONTROL OY, Vantaa (FI)

(72) Inventors: Joona Nikunen, Pirkkala (FI); Ville Viikari, Espoo (FI)

(73) Assignee: METSO FLOW CONTROL OY, Vantaa (FI)

( * ) Notice: Subject to any disclaimer, the term of this patent is extended or adjusted under 35 U.S.C. 154(b) by 0 days.

(21) Appl. No.: 15/507,408

(22) PCT Filed: Sep. 2, 2015

(86) PCT No.: PCT/FI2015/050573
§ 371 (c)(1),
(2) Date: Feb. 28, 2017

(87) PCT Pub. No.: WO2016/034772
PCT Pub. Date: Mar. 10, 2016

(65) Prior Publication Data
US 2017/0228626 A1 Aug. 10, 2017

(30) Foreign Application Priority Data
Sep. 3, 2014 (FI) .................................. 20145763

(51) Int. Cl.
*G06K 17/00* (2006.01)
*G06K 7/10* (2006.01)

(52) U.S. Cl.
CPC ..... *G06K 17/0022* (2013.01); *G06K 7/10366* (2013.01)

(58) Field of Classification Search
None
See application file for complete search history.

(56) References Cited

U.S. PATENT DOCUMENTS

2006/0255131 A1 11/2006 Stewart
2010/0148933 A1 6/2010 Dacus
(Continued)

FOREIGN PATENT DOCUMENTS

WO 2013/093476 A2 6/2013
WO 2015/101695 A1 7/2015

OTHER PUBLICATIONS

Guerin et al., "A temperature and gas sensor integrated on a 915MHz RFID UHF tag," 2010 IEEE International Conference, 2010.
(Continued)

*Primary Examiner* — Kristy A Haupt
(74) *Attorney, Agent, or Firm* — Oliff PLC

(57) ABSTRACT

A radio frequency identification (RFID) reader sequentially carries out inventory rounds with passive RFID sensor tags. Each RFID sensor tag has at least one sensing element arranged to sense a predetermined quantity. The reader reads one value of the predetermined quantity based on a backscattering modulation frequency used by the passive RFID sensor tag during each inventory round and releases the RFID sensor tag prior to reading next value of the predetermined quantity based on a backscattering modulation frequency used by the passive RFID sensor tag during a subsequent inventory round. If the passive RFID sensor comprises two or more sensing elements having different sensor characteristics, the reader reads one of the sensing elements of the passive RFID tag during one inventory round and releases the passive RFID sensor tag prior to reading another one of the sensing elements of the passive RFID sensor tag during a subsequent inventory round.

11 Claims, 7 Drawing Sheets

(56) References Cited

U.S. PATENT DOCUMENTS

| | | | |
|---|---|---|---|
| 2010/0156606 A1* | 6/2010 | Gold | H04Q 9/00 340/10.4 |
| 2010/0188197 A1 | 7/2010 | Ackley | |
| 2011/0301903 A1 | 12/2011 | Humbert et al. | |
| 2013/0057392 A1 | 3/2013 | Bullock | |
| 2013/0099897 A1 | 4/2013 | Forster | |
| 2013/0265139 A1* | 10/2013 | Nummila | G01K 1/024 340/10.1 |

OTHER PUBLICATIONS

Chen et al., "Coupling Passive Sensors to UHF RFID Tags," IEEE, 2012, pp. 255-258.

Mar. 2, 2015 Search Report issued in Finnish Patent Application No. 20145763.

Oct. 21, 2015 International Search Report issued in International Patent Application No. PCT/FI2015/050573.

Nov. 3, 2016 International Preliminary Report on Patentability issued in International Patent Application No. PCT/FI2015/050573.

\* cited by examiner

Fig. 3B

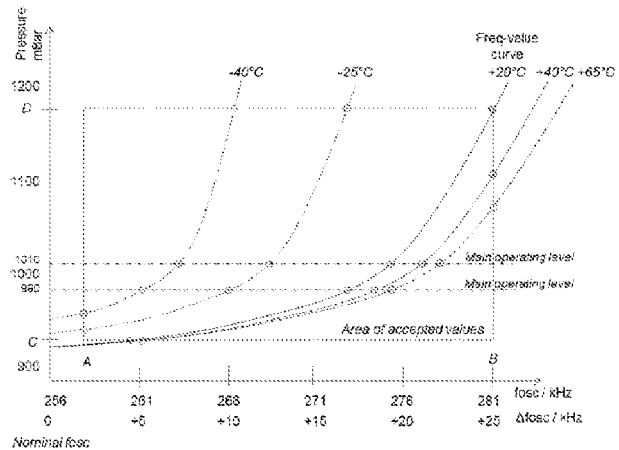

Fig. 3C

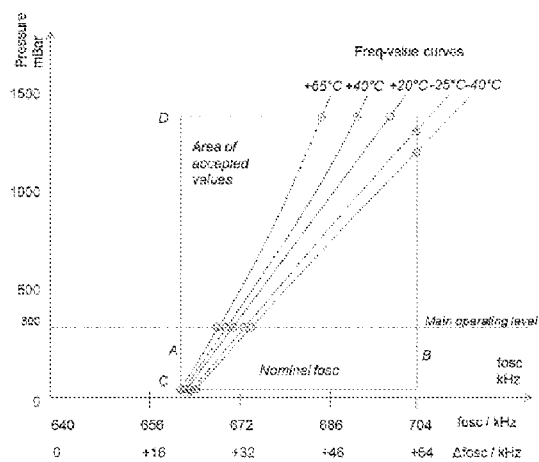

Fig. 3D

Tag EPC   48.2.0012345.654321.000056789012

| Sensor 1 | ID | 33569 |
|---|---|---|
| Sensor 1 | class | pressure |
| Sensor 1 | type | air |
| Sensor 1 | quantity | mBar |
| Sensor 1 | frequency | 256 kHz |
| Sensor 1 | frequency-range [A,B] | 2-25 kHz |
| Sensor 1 | value-range [C,D] | 940-1180 |
| Sensor 1 | Main operating level | 990 |
| Sensor 1 | Main operating level | 1010 |
| Sensor 1 | freq-value table -40C | A:960-5-6,5-10:D |
| Sensor 1 | freq-value table -25C | A:950-9,5-12-16,5:D |
| Sensor 1 | freq-value table +20C | 4:C-16,5-19-B:D |
| Sensor 1 | freq-value table +40C | 5:C-18-21-B:1105 |
| Sensor 1 | freq-value table +65C | 5:C-19-22-B:1080 |
| Sensor 1 | sensor speed | 1 |
| Sensor 1 | Calibration date | 41897 |
| Sensor 1 | Valid until | 15.9.2019 |

| Sensor 2 | ID | 56623 |
|---|---|---|
| Sensor 2 | class | gas |
| Sensor 2 | type | carbon monoxide |
| Sensor 2 | quantity | ppm |
| Sensor 2 | frequency | 640 kHz |
| Sensor 2 | frequency-range [A,B] | 22-64 kHz |
| Sensor 2 | value-range [C,D] | 30-1400 |
| Sensor 2 | Main operating level | 300 |
| Sensor 2 | freq-value table -40C | A:C-35-B:1200 |
| Sensor 2 | freq-value table -25C | 23:C-33-B:1350 |
| Sensor 2 | freq-value table +20C | 24:C-30-59:D |
| Sensor 2 | freq-value table +40C | 25:C-28-52:D |
| Sensor 2 | freq-value table +65C | 26:C-26-44:D |
| Sensor 2 | sensor speed | 5 |
| Sensor 2 | Calibration date | 41897 |
| Sensor 2 | Valid until | 15.12.2014 |

RFID READING METHOD AND RFID READER

FIELD OF THE INVENTION

The present invention relates to passive wireless sensors, particularly passive radio frequency identification (RFID) sensors, RFID sensor systems, and RFID readers for passive RFID sensor tags.

BACKGROUND OF THE INVENTION

Sensor is a device that transforms a measured quantity into a readable format, typically into an electrical signal. Nowadays, there are commercially available sensors virtually for any measurement purpose. According to the connectivity, sensors can be divided into wireless and wired sensors. Wired sensors are connected via wiring harnesses or cable assemblies to a reader device. Wireless sensors can be read without a physical connection to the sensor, and are often realized equipping the sensor with a radio transceiver. The transmitted radio signal is interpreted by a receiver which converts the wireless signal into a desired output. Wireless operation can be beneficial in many applications, where wired connection is difficult for example due to harsh operating conditions (like temperature and pressure), rotating parts, or cost and complexity of wiring. However, wireless sensors also have some drawbacks such as limited lifetime due to battery, limited read-out distance due to attenuation and interference, security issues because of the uncontrollable propagation of the signal and potentially low speed of communication. Based on the power source and communication principle, wireless sensors can be divided into three categories: active sensors, semi-passive sensors and passive sensors.

Active wireless sensors usually have both a radio transceiver and an on-board battery that is used to power up the transceiver. Active wireless sensors, having their own power sources, can use powerful transmitters and sensitive receivers. However, the battery on board limits the life time and also increases the size and weight. Due to more complex circuit, the price of an active sensor can be much higher than that of a passive sensor.

Semi-passive wireless sensors do not contain a radio transceiver, but are equipped with a battery. The battery is used to power up an integrated circuitry (IC) and enables the sensors to operate independently of the reader device or to maintain memory in the sensor. Semi-passive battery-assisted sensors utilize modulated backscattering technique for communication. This means that semi-passive sensors do not require any power from the on-board battery for transmission, but the sensor simply reflects back some of the power emitted by the reader device.

Unlike the active and semi-passive sensors, passive sensors do not require an on-board battery. Therefore they can be less complex, smaller, more inexpensive, and their lifetime is not limited by the power supply. The typical read-out distance of passive wireless sensors is between 10 cm and 3 m. Passive wireless sensors can be divided into four main categories: radio frequency identification (RFID) tags, electrical resonance circuit sensors, surface acoustic wave (SAW), harmonic sensors and intermodulation sensors.

RFID is an identification technology that uses radio waves to communicate between tags and a reader and it is used to identify items. There are a few advantages of RFID over optical barcode identification such as no line-of-sight is required between the reader device and the tag, and the RFID reader can also read hundreds of tags at a time. Passive RFID tags utilize the modulated backscattering communication principle which is illustrated in FIG. 1. When a tag 10 communicates with an RFID reader 11, it modulates the received signal 12 and reflects a portion of it 13 back to the reader. A typical passive tag consists of an antenna connected to an application specific microchip. When wirelessly interrogated by an RFID transceiver, or reader, the RFID tag antenna receives power and RF signals from the RFID reader and provides them to the chip. The chip processes the signals and sends the requested data back to the RFID reader. The backscattered signal is modulated according to the transmitted data. The highest operation frequency and read-out distance of RFID are limited by the rectified power for the integrated circuit (IC) and are a few GHz and 5-10 m, respectively.

RFID is mostly used for identification. RFID tags are equipped with a rewritable memory, which enables the reusability features of RFID tags, but they are not useful for measuring external quantities. RFID has also been shown to be suitable for sensing by equipping an RFID tag with an external sensor and digital logic to read the external sensor. The advantage of this approach is that it would use a generic sensor element and thus would be well suited for a very broad range of applications. In this approach, however, an additional A/D converter and digital circuitry has to be included to the tag in order to enable sensor read-out. Increased power consumption due to the additional electronics reduces the read-out range significantly (e.g., from 5 m to 0.3 m with an 8-bit A/D converter). Additional sensor element further increases power consumption. Implementation considerations of the A/D converter and additional digital circuits are discussed in [1]: Chapter 9 "Smart RFID Tags", in the book "Development and Implementation of RFID Technology", ISBN 978-3-902613-54-7, February 2009, I-Tech, Vienna, Austria. http://www.intechopen.com/books/development_and_implementation_of_rfid_technology.

US2013/0099897 discloses an RFID reader, an RFID chip, and an antenna electrically coupled to the RFID chip and configured to receive signals from and transmit signals to the RFID reader. The RFID chip is provided with an electrical interface to a sensing material. The RFID chip is configured to modulate a signal received from a reader and to drive the sensing material with the modulated signal. The sensing material has a variable electrical property, such that the backscattered modulated signal will change according to the condition of the sensing material. Regardless of the nature of the sensing material, it interacts with the modulated signal from the RFID chip and returns the signal to the RFID chip. The returned signal is passed from the RFID chip to the antenna via the backscatter modulator and then transmitted back to the RFID reader. Alternatively, the signal processed by the sensing material is used to modulate the input impedance of the RFID chip, with a signal from the RFID chip being backscattered to the RFID reader by the antenna to determine the condition of the sensing material.

US 2011/0301903 proposes to calibrate the sensor of a transponder, e.g., a sensor in an RFID tag, during its use rather than in an extra calibration step at the manufacturer, thus saving the related cost. Initial conditions of many products, which are to be monitored by a sensor, are well defined and known to the manufacturer of the products. Examples of such initial conditions include the following: the temperature in the refrigerated warehouse, where the products are stored between production and shipment; the pH-value of a liquid such as milk and wine; the composition of gasses in a container that has been packed under controlled environmental conditions. These well-defined conditions can be used as reference for sensor calibration. Accordingly, in the invention, the sensor is being calibrated against a reference that itself is characteristic of the very environment of the sensor's operational use.

Chen et al, Coupling Passive Sensors to UHF RFID Tags, Radio and Wireless Symposium (RWS), 2012 IEEE, 15-18 Jan. 2012, Santa Clara, 255-258, explores the possibility of coupling passive sensor data to existing UHF RFID tags without designing a new tag ASIC. The existing UHF RFID system can be used to convey additional data by overlaying a coupling loop on the tag antenna and modulating vector backscatter. The impedance of the passive sensor carrying the sensor data influences the value of amplitude and phase of the backscattering. For the transmission of the passive sensor data, the load of the passive sensor coupling module is switched between these three loads to provide the connection to one of the two reference impedances or the passive sensor. With two reference impedances, the impedance of the passive sensor is determined.

Guerin et al., A temperature and gas sensor integrated on a 915 MHz RFID UHF tag, Wireless Information Technology and Systems (IC-WITS), 2010 IEEE International Conference, Honolulu, Aug. 28, 2010-Sep. 3, 2010 discloses a passive wireless sensor utilizing the modulated backscattering principle. The modulation signal is generated by a voltage-controlled oscillator whose control voltage and thereby the output frequency is arranged to change in function of the sensor value.

Co-pending PCT/FI2013/051214 discloses passive wireless sensor design that enables a radically increased reading distance of passive wireless sensors. The modulation signal is generated by an oscillator that includes a sensing element as a part of an oscillating circuit, such that the modulation frequency is dependent on a sensed value of the sensing element. Thus, the sensor value is translated into a frequency of modulated analog signal which can be generated without an energy consuming AD conversion and with minimum number of extra component. As a result the reading distance can be increased up to several meters, to a room scale.

Due to the short reading distances there has not been need to manage multiple passive wireless sensor tags within the range of a reader. All passive wireless sensors currently available are single-purpose sensors which are usable with a dedicated reader.

The UHF RFID technology (such as the standard Class-1 Gen-2 anti-collision) has tackled most of the issues concerning reading of multiple wireless tags. However since there has not been any need to think of remote sensors, all RFID solutions have passed the issues of sensor value conversions, temperature compensations or a calibration, for example.

Thus, there is a need to provide methods, routines and arrangements for managing and reading multiple passive wireless sensors having different sensor characteristics.

BRIEF DESCRIPTION OF THE INVENTION

An object of the present invention is to provide a new reading technique for passive RFID sensor tags.

The object of the invention are achieved by a method, an RFID reader and an RFID sensor system according to the attached independent claim. The preferred embodiments of the invention are disclosed in the dependent claims.

An aspect of the invention is a method for reading a passive radio frequency identification (RFID) sensor tag having at least one sensing element arranged to sense a predetermined quantity, comprising
  an RFID reader sequentially carries out inventory rounds with a passive sensor tag,
  RFID reader reads one value of the predetermined quantity based on a backscattering modulation frequency used by the passive RFID sensor tag during each inventory round and releases the RFID sensor tag prior to reading next value of the predetermined quantity based on a backscattering modulation frequency used by the passive RFID sensor tag during a subsequent inventory round.

In an embodiment, the passive RFID sensor comprises two or more sensing elements having different sensor characteristics, the method further comprising
  RFID reader reads one of the sensing elements of the passive RFID tag during one inventory round and releases the passive RFID sensor tag prior to reading another one of the sensing elements of the passive RFID sensor tag during a subsequent inventory round.

In an embodiment, the method comprises
  the RFID preselects a sensing element for the next inventory round during a present inventory round carried out with a presently selected sensing element.

In an embodiment, the preselecting of a sensing element for the next inventory round comprises sending a query signal with a sensor activation command to the passive RFID sensor tag during the present inventory round carried out with the presently selected sensing element, the sensor activation command defining which one of the sensing elements is activated in the passive RFID sensor tag.

In an embodiment, the sensor activation command comprises predetermined bits or bit patterns in the RFID query signal.

In an embodiment, the sensor activation command is configured to control a sensor selector in the passive RFID tag.

In an embodiment, the preselecting of a sensing element for the next inventory round during a present inventory round carried out with a presently selected sensing element comprises the RFID reader accessing a memory location or a register that controls a selection and activation of the sensing elements in the passive RFID sensor tag, preferably controlling a sensor selector in the passive RFID sensor tag.

In an embodiment, wherein using a default sensing element in the passive RFID sensor tag until a selection of a sensing element is made by the RFID reader, such as during a first inventory round.

In an embodiment, the default sensing element comprises a sensing element or a resonator with known temperature dependence, and wherein the RFID reader reads the temperature of the passive RFID tag based on the backscattering modulation frequency of the passive RFID sensor tag having the default sensing element activated, and the RFID reader uses the read temperature to cancel the effect of the temperature variation from the backscattering modulation frequency of the passive RFID sensor tag when other than the default sensing element is activated.

In an embodiment, the RFID reader reads multiple passive RFID sensor tags during one inventory round.

An aspect of the invention is an RFID reader implementing the method according to the first aspect.

An aspect of the invention is a RFID sensor system, comprising an RFID reader implementing the method according to the first aspect as well as a plurality of passive RFID sensor tags with at least one sensing element for sensing a predetermined quantity, the backscattering modulation frequency of the passive RFID sensor tags being dependent on a value of a quantity sensed by a respective sensing element.

BRIEF DESCRIPTION OF THE DRAWINGS

In the following the invention will be described in greater detail by means of preferred embodiments with reference to the drawings, in which

FIGS. 3B and 3C are graph illustrating examples of modulation frequency-sensor value correlation curve for a pressure sensor and a gas sensor, respectively;

FIG. 3D illustrates exemplary sensor configuration information that may be provided or stored for an RFID sensor;

DETAILED DESCRIPTION OF THE INVENTION

Figure 1:
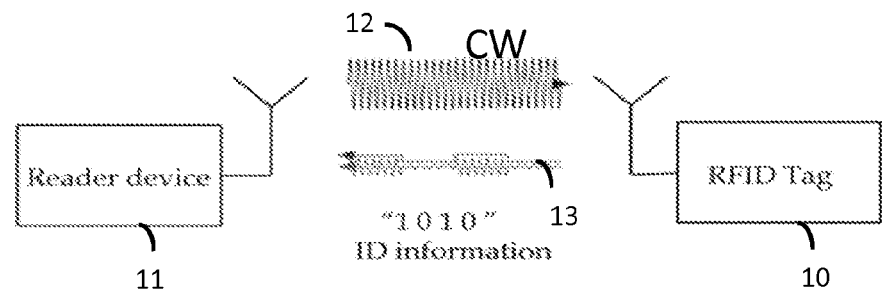
FIG. 1 illustrates backscattering communication principle in an RFID system.

Referring to FIG. 1, an RFID system typically comprises two basic components: an RFID transponder or tag 10, which is located on the object to be identified or at a measurement point; an RFID interrogator or reader 11, which performs the interrogation of RFID tags. In a passive RFID system the RFID reader 11 supplies the tag 10 with essential power in order for it to perform modulation of the reader's interrogation signal. In the case of RFID sensor tags, in addition to just providing a power source and medium for the RFID tags 10 to operate and transmit data, an RFID reader 11 may perform data transmission, which is implemented, in most cases, as a modulation of the carrier signal, towards the tags 10.

Figure 2A:
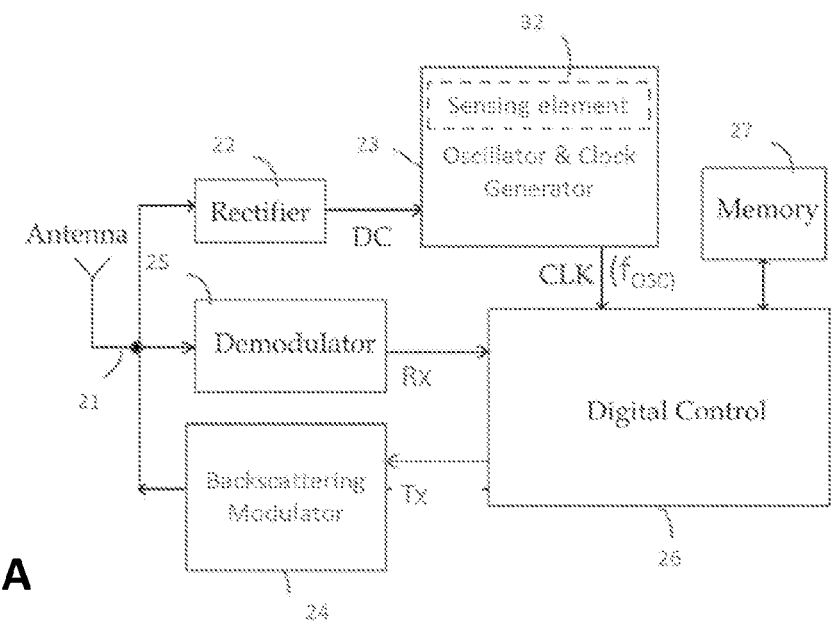
FIG. 2A is a functional block diagram illustrating an example of a an RFID tag architecture.

FIG. 2A shows a functional block diagram illustrating a further example of radio frequency identity (RFID) tag architecture. In the illustrated example the RFID tag 10 may comprise an antenna 21 directly matched to the tag's front end impedance (matching circuit is not shown) to communicate with an RFID reader 11; an analogue RF front end that may typically contain rectifier circuitry 22 to convert RF power into a direct current (DC), a clock generator or oscillator 23, a backscatter modulator 24 and a demodulator 25. The clock generator 23 may also provide a square-wave clock or clocks for the tag. In conventional RFID tags, where no oscillator is present in the tag, the clock generator 23 may generate the clock from the received RF frequency, e.g. by divider circuits There may also be a logic part or a digital control module 26 that may be configured to provide desired functions, such as to handle interrogating commands, execute the anti-collision protocol, perform the data integrity check, run memory read-write operations, and perform output control and data flow. The logic implementation usually follows a defined standard and a certain associated protocol. Further, a memory storage 27 may be provided. Depending on a user's requirement, a non-volatile memory storage may be needed if both read/write capability is implemented.

As discussed above, the passive RFID tags utilize the modulated backscattering principle for communication. When a tag is illuminated with an RF CW signal transmitted from the reader, the tag modulates the received signal and reflects a portion of it back to the reader. The RFID sensor is actuated using a radio frequency (RF) carrier wave (CW) signal transmitted from the reader 11. First, the RF signal is converted to DC voltage by a rectifier 22. The rectified voltage powers up an oscillator 23, which produces a low frequency sinusoid signal fOSC at its output. Finally, the oscillation signal fOSC is fed to the backscatter modulator 24 to realize the backscattering principle. The modulator 24 modulates the signals, and those going back to the antenna 21 depend on the matching between the antenna and the rectifier 22/modulator 24. As a consequence, there are sidebands or subcarriers fCW−fOSC and fCW+fOSC in the signal backscattered from the sensor, as illustrated in the FIG. 3A, fCW and fOSC represent the carrier frequency and oscillation frequency, respectively The sidebands or subcarriers are offset from the carrier fCW by the oscillation frequency fOSC. The oscillation frequency fOSC may also be referred to as a backscattering modulation frequency or a subcarrier frequency.

The clock frequency generation 23 may be realized with an oscillator whose frequency is dependent on a sensed value. This enables the sophisticated features of RFID and the possibility to measure external quantities without AD conversion. In exemplary embodiments, a sensing element (e.g. as illustrated by a sensing element 32 in FIG. 2A) is configured to be an elementary part of an oscillating circuit of a tag oscillator such that the modulation frequency output from the oscillator is dependent on a sensed value, i.e. a value range of sensed quantity is mapped to an oscillation frequency range. This enables the possibility to measure external quantities without practically any power consuming extra components and the possibility to measure external quantities without reducing the read-out distance. The concept is compatible for existing RFID tags. Examples of applicable oscillators may include an RC oscillator, a ring oscillator, an LC-oscillator, an RLC-oscillator, or any other resonant-based oscillator, such as an oscillator based on MEMS (microelectromechanical systems), SAW (surface acoustic wave), and BAW (bulk acoustic wave) resonators. The advantage of an RC-oscillator is that it can be integrated while it may have higher power consumption and thus the read-out distance may be reduced in comparison with LC-oscillator or an RLC-oscillator, for example.

It should be appreciated that the intention is not to restrict the invention to any particular types of RFID sensor tags or any particular way of changing modulation frequency of a backscattered signal by a sensor tag. However, embodiments of the invention are particularly advantageous in applications where a modulation frequency oscillator of a tag is directly loaded with a sensing element which tunes the oscillation frequency, i.e. the sensing element is operationally part of the oscillator.

Figure 2B:
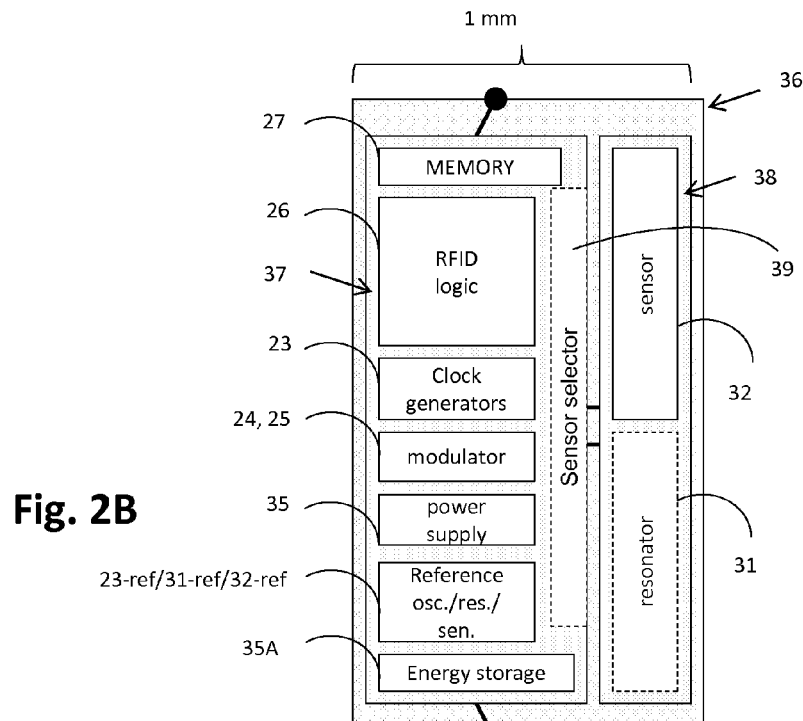
FIG. 2B illustrates an exemplary layout of a passive wireless sensor tag.

FIG. 2B illustrates an exemplary layout of a passive wireless sensor tag according to the first aspect of the invention. The wireless sensor may be formed on a single semiconductor substrate (e.g. silicon substrate) or chip 36. The manufacturing price of the device is proportional to the size of the device on the substrate 36, so that it is desirable to minimize the size. In the example, the size is approximately 1 mm×2.5 mm. The wireless sensor tag may include normal RFID circuits and functions (such as rectifier/modulator/demodulator 24/25, logic 26 and memory 27) as well as a sensor-loaded clock generator or oscillator 23, such as those described in other exemplary embodiments. There may also be a power supply 35 (such as a rectifier 22) for generating appropriate operating voltage(s) for the circuitry from the received RF power. There may also be additional energy storage 35A (such as a capacitor with large capacitance) for harvesting and storing a larger amount of energy from the received RF power over a longer period of time. The larger energy storage 35A may be needed for sensor elements with high power consumption, e.g. a gas sensor.

A sensor element 32 may be integrated with the oscillator 23 or it may be a separate element connected to operate as a part of the oscillator. In the exemplary layout illustrated in FIG. 2B, a sensor element 32 may be manufactured on a separate die 38 which is different from a die 37 which the other components of the wireless sensor tag 10 are made on. The manufacturing technique of a sensor element 32 may vary from one sensor element type to another. The sensor element 32 can be designed and manufactured without restrictions due to the manufacturing techniques and requirements of the other components of the wireless sensor tag, which may be substantially the same for all sensor element types.

Optionally, there may also be a resonator part 31 of the oscillator 23, if a separate resonator element is needed, as illustrated by a dashed line. The resonator 31 can be tuned and designed to operate with the specific sensor element 32 in question. Having a separate die for each pair of a resonator 31 and a sensor element 32 may allow optimal sensing functionality and accuracy as well as optimal size of the resonator and the sensor element. Passive wireless sensors for different measuring quantities can be readily provided by making different tuned pairs of resonators 31 and sensor elements 32. Also other sensor element-specific components or structures may be made on the die 38 with the sensor element 32, such as the larger energy storage 35A (which can be omitted from the basic component die 37 to save in size and price of the sensor tags not requiring extra energy).

RFID specifications typically require that an RFID tag must support the entire modulation frequency range of the RFID system, e.g. ISO 18000-6C standard defines 40-640 kHz modulation frequency range. In other words, an RFID tag must respond to a reader signal at any modulation frequency within the defined frequency range. However, it is challenging for an oscillator 23 both to support such a wide frequency range and provide an accurate sensing data transmission by changing oscillation frequency of a backscattered signal by a sensing element. The oscillator 23 with a resonator 31 and a loading sensing element 32 may be optimized to operate within a narrow frequency range at a specific resonant frequency or oscillation frequency range, such as 256 kHz±10%=226-281 kHz. Thus, there are contradicting requirements for the oscillator 23 of the tag 10.

According to an aspect of the invention a passive wireless sensor tag may also include a reference oscillator, such as a reference oscillator 23-ref, or a reference load, such as a resonator 31-ref or a reference sensor 32-ref which may preferably be made on the die 37. The oscillator 23 may be selectively connectable to the reference load 31-ref/32-ref and the resonator or resonators 31, or the sensor or sensors 32, one at time. The reference load 31-ref/32-ref may be implemented and configured such that the combination of the oscillator 23 and the reference load 31-ref/32-ref provides an RFID tag operation that meets the requirements of the n operation over a wide oscillation frequency range required by relevant RFID specifications. The combination of the oscillator 23 and the reference load 31-ref/32-ref may be implemented as a RC-oscillator or a ring oscillator, for example, which can be readily integrated on an integrated chip. The reference load 31-ref/32-ref may comprise both a reference resonator 21-ref and an associated sensor, such as a temperature sensor. The combination of the oscillator 23 and the reference load 31-ref/32-ref may be used during an initial communication with a reader 11 when the reader 11 makes an inventory of passive wireless sensor tags within reading range and collects sensor tag-specific information, or during calibration procedure, for example. The combination of the oscillator 23 and the reference load 31-ref/32-ref can be optimized for this purpose and enables the tag to react to the reader commands adequately at the any carrier oscillation frequency fosc used by the reader. The actual resonator or resonators 31 and sensor or sensors 32 can be configured or optimized for sensing, and may therefore be less suitable for the initial communication or handshake with the reader 11. The same applies to a sensor-specific resonator 31. Therefore, it may be advantageous to use the actual sensor or sensors 32 or the resonator or resonators 31 with the oscillator 23 for the transferring the sensed values only; for example after the initial communication when the passive wireless sensor tag 10 is ready and/or commanded to send the actual sensor values.

In an embodiment, a reference oscillator 23-ref may be provided in addition to the oscillator 23. The reference oscillator 23-ref may be configured to operate instead of the oscillator 23 to meet the RFID specifications in a similar manner as explained for the combination of the oscillator 23 and the reference load 31-ref/32-ref above. However, use of one oscillator 23 selectively connectable to the reference load 31-ref/32-ref and the actual resonator(s) 31 or sensor(s) 32 may result in smaller size and manufacturing cost of the RFID chip.

As discussed above, conventional RFID sensor tags transfer the sensor measurement data as digital values modulated in a fixed (within a tolerance) oscillation frequency subcarrier, e.g. with binary phase shift keying (BPSK) or amplitude shift keying (ASK). Thus, a possible drift of the oscillation frequency due to the temperature does not effect on the sensor values transmitted. Only a sensing element itself, such as a pressure sensor, may require calibration during manufacturing or use, for example as proposed in US 2011/0301903.

In embodiments of the invention, the oscillator frequency fosc is generated with an oscillator whose frequency is varied dependent on a sensed value, such as a pressure. A change in the sensed value, such as a pressure value, causes a change in the oscillation frequency fosc. If the oscillation frequency drifts or varies also due to the temperature dependence of the oscillator 23, there will be error in the received oscillation frequency and thereby in the sensed value detected by the reader. Thus, from accuracy point of view it may be crucial to distinguish between the oscillation frequency variation caused by changes in the actual sensed quantity and between the oscillation frequency variation caused by the temperature dependence of an oscillator. Example of a temperature dependence of the modulation frequency fosc is illustrated in FIG. 3B and will be described below.

Therefore, according a further aspect of the invention, the reference oscillator 23-ref or the reference load 31-ref/32-ref may be used for temperature compensation, as an alternative or in addition to other uses. For example, the temperature dependence of the oscillation frequency fosc of the oscillator 23 used with the reference load 31-ref/32-ref may be predefined or known, and thereby the temperature of the passive wireless sensor tag may be determined from the oscillation frequency fosc of the r oscillator 23, because the oscillation frequency fosc is only affected by a temperature. The reader 11 may then utilize the obtained temperature information for temperature compensation and/or calibration of the tag, and particularly the oscillation frequency fosc of the oscillator 23 when used with the actual resonator 31, the actual sensor 32 or a pair of the resonator 31 and the sensor element 32. Otherwise it may not be possible to accurately cancel the effect of the temperature in the value of a sensed quantity.

According to an aspect of the invention, there may optionally be means 39 for connecting the reference load 31-ref/32-ref, the sensor 32 or the pair of the resonator 31 and the sensor element 32 selectively, one at time, to load the oscillator 23 such that the modulation frequency output from the oscillator 23 is dependent on a sensed value of the predetermined variable of the sensor element 32. Similarly, means 39 may be arranged to switch between use of the oscillator 23 and the reference oscillator 23-ref. An oscillator mode with the reference oscillator 23-ref or the reference load 31-ref/32-ref f connected may be a default configuration of the sensor selector 39 at startup. Examples of selecting means 39 and their control will be given below.

Figure 2C:
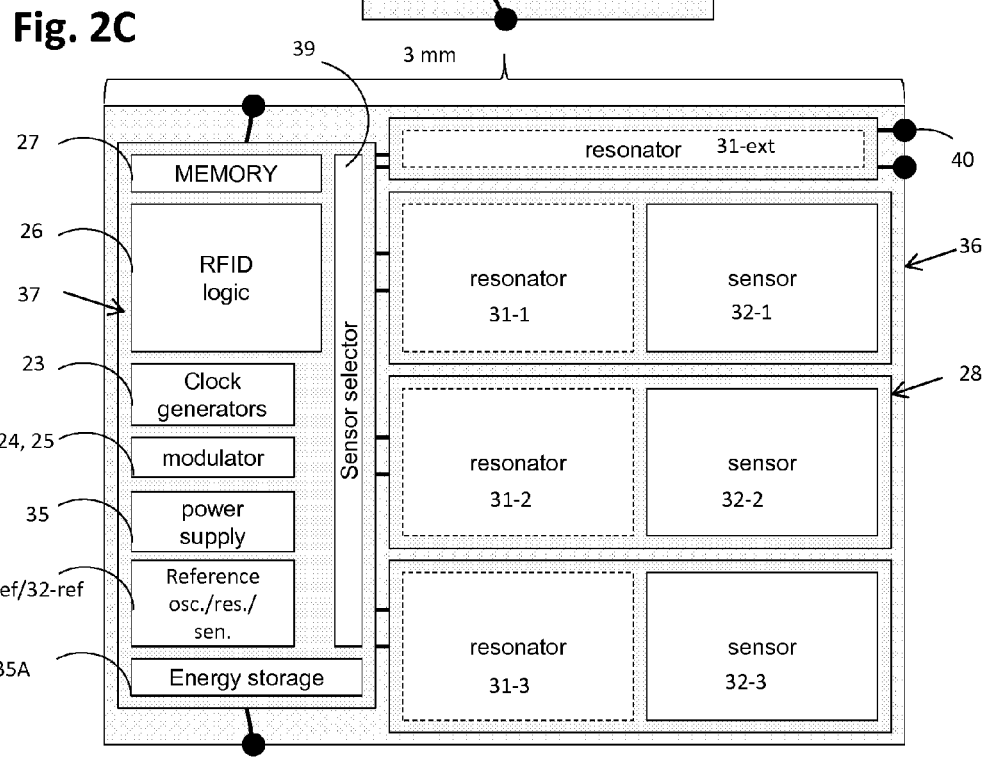
FIG. 2C illustrates another exemplary layout of a passive wireless sensor tag.

FIG. 2C illustrates another exemplary layout of a passive wireless sensor tag according to an aspect of the invention. In this exemplary embodiment, a passive wireless sensor tag 10 may be provided with one or more sensor elements 32-1, 32-2, 32-3, and/or one or more pairs of a tuned resonator 31-1, 31-2, 31-3 and a sensor element 32-1, 32-2, 32-3, respectively. Additionally, the resonator may be combined with a discrete component, such as a coil and capacitor. This may be necessary, if big inductance values are needed. Each sensor element or each pair of a tuned resonator and a sensor element may be made on a separate dedicated die 28, which provides advantages described above. Moreover, it is easy to make passive wireless sensor tags with different number and different combinations of sensed quantities, according to demands of an application in question. Alternatively or in addition to an in-built sensor element or a pair of a resonator and a sensor element, an external sensor element (not shown) may be connectable via connection terminals 40. Such external sensor element may be, for example, a position sensor of a valve. There may also be a resonator 31-ext tuned for the external sensor element. The components on the die 37 may be similar to those illustrated with reference to FIG. 2B except that there may be means for connecting the sensor elements and/or the pairs of a resonator and a sensor element selectively, one at time, to load the oscillator 23 such that the modulation frequency output from the oscillator 23 is dependent on a sensed value of the predetermined variable of the sensor element 32. In other words, one sensor element or one pair of a resonator and a sensor element can be selected to load the oscillator at a time and thus affect the oscillation frequency. This way the sensor can be equipped with multiple sensor elements which can be read individually. For example, the wireless sensor tag may comprise a sensor element selector 39, such as a switch circuit or an analog multiplexer arranged to selectively connect one and disconnect the remaining ones of the sensor elements and/or the resonator-sensor element pairs to and from the oscillator 23. The selective enabling, switching or connecting may be carried out according to a predetermined sequence. Alternatively, a reader device can send to the wireless sensor tag a command indicating which sensor element 32-1, 32-2, 32-N is activated or switched on. For example, the logic 26 may receive a selection or activation command from the reader and control the selector 39 accordingly.

Figure 2D:
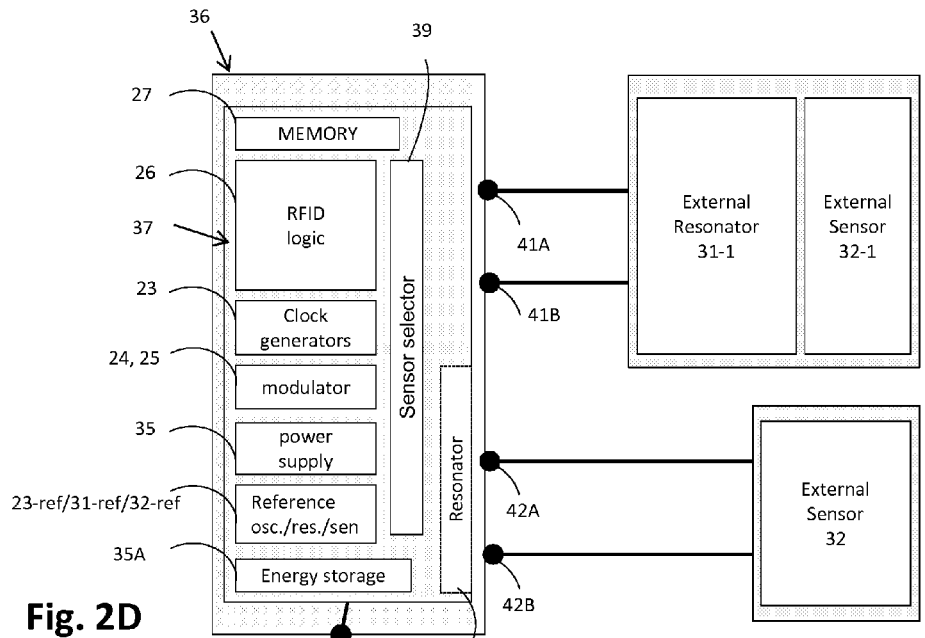
FIG. 2D illustrates still another exemplary layout of a passive wireless sensor tag.

The size of the RFID chip formed on a semiconductor substrate (e.g. silicon substrate) or chip 36 and thereby the manufacturing cost are further reduced in still another exemplary layout of a passive wireless sensor illustrated in FIG. 2D. Same reference symbols in FIG. 2D and in FIGS. 2A, 2B, and 2C may refer to similar functions and structures. The main circuit illustrated in FIG. 2D differs from the circuits illustrated in FIGS. 2A and 2B in that no internal sensors (except possibly a temperature sensor or resonator for temperature compensation purposes) may be implemented on an integrated RFID tag chip 36. The integrated RFID tag chip 36 comprises connecting terminals 41A, 41B, 42A and 42B to which one or more external sensors 32 or pairs of external resonators 31-1 and sensors 32-1 can be connected. The integrated RFID chip 36 is preferably a universal chip that may comprise only functions and structures common to all sensing application for implementing aspects of invention. Such functions and structures include at least the clock generator or oscillator 23 whose frequency output is dependent on a sensed value, i.e. a value range of sensed quantity is mapped to an oscillation frequency range of the tag; a reference load, such as a reference resonator 31-ref; means switching a reference load 31-ref, resonators, sensors 32 or pairs of the resonator and the sensor element selectively, one at time, to load the oscillator; and memory 27 storing frequency correlation information.

The integrated RFID tag chip 36 may also comprise one or more internal resonators 31. For example, common capacitive sensors may be connected to use an internal chip resonator 31. On the other hand, external resonators 31-1 can more easily be implemented with larger size components, such as an LC resonator with a large capacitor and/or an external coil. An LC resonator allows a more accurate sensor and a longer reading range. The external resonators and sensors can be matched to each other.

Figure 2E:
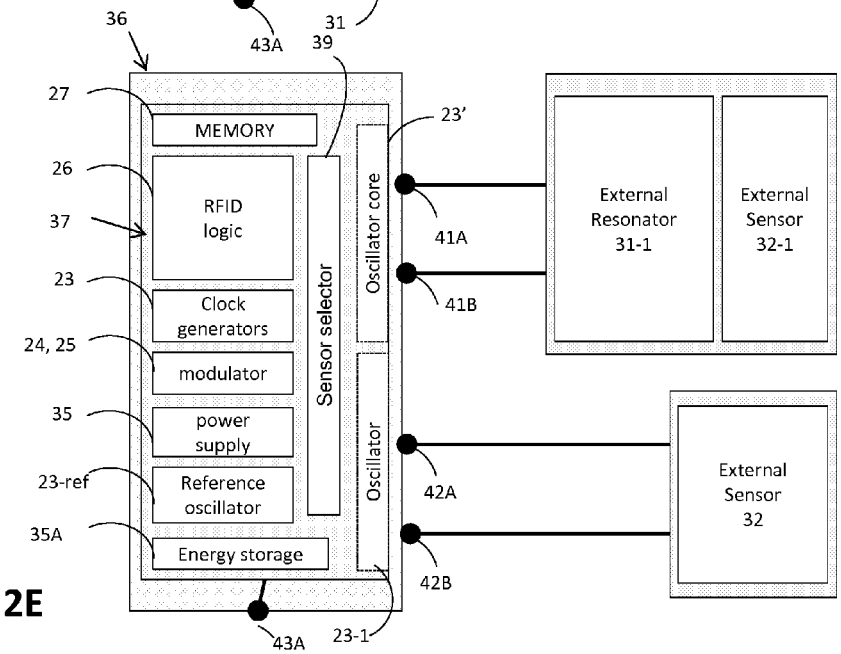
FIG. 2E illustrates still another exemplary layout of a passive wireless sensor tag.

FIG. 2E illustrates still another exemplary layout of a passive wireless sensor tag according to an aspect of the invention. Same reference symbols in FIG. 2E and in FIGS. 2A, 2B, 2C and 2D may refer to similar functions and structures. In this exemplary embodiment, a passive wireless sensor tag 10 may be provided with multiple oscillators. Reference oscillator 23-ref may be provided as discussed regarding various embodiments of the invention. An oscillator core 23' comprises oscillator configuration suitable for operating with to an external pair of pairs of external resonators 31-1 and sensors 32-1 connected connecting terminals 41A and 41B. Basically the oscillator core 23' is the oscillator 23 incorporated to the clock generators block 23 discussed with reference to FIGS. 2A, 2B, 2C and 2D herein, or similar to the oscillator 23. An oscillator 23-1 is comprises oscillator configuration suitable for operating with an external sensor 32 connected connecting terminals 42A and 42B. Basically the oscillator 23-1 is the resonator 31 in combination with the oscillator 23 incorporated to the clock generators block 23 discussed with reference to FIGS. 2A, 2B, 2C and 2D herein, or similar to the the combination of the oscillator 23 and the resonator 31.

Figure 2F:
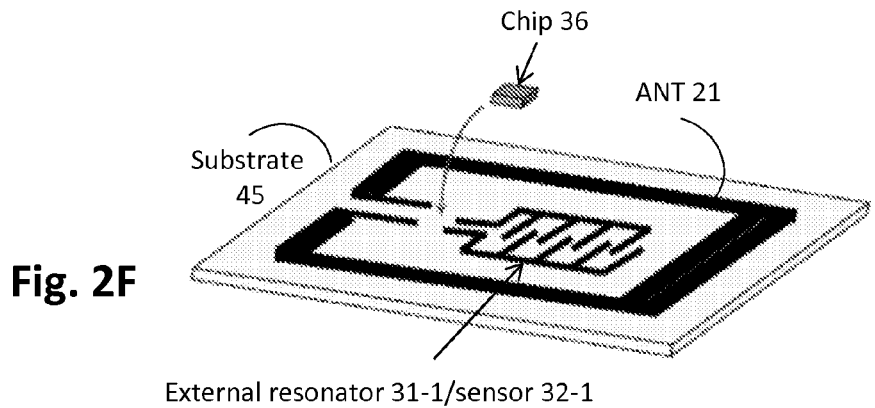
FIG. 2F illustrates example of a passive wireless sensor tag having an RFID chip and external resonator/sensor bonded on a carrier substrate.

FIG. 2F illustrates an exemplary passive RFID tag which may comprises an RFID chip 36 according aspects of the invention, and an external antenna 21 as well as an external resonator 31-1 and/or an external sensor 32-1 provided on a common carrier substrate 45. The antenna 21 and the external resonator/sensor 31/32 may be made on the substrate by printing conductive wiring, or a MEMS device, for example. The RFID chip 36 may be connected to the antenna 21 and the resonator/sensor 31/32 by means of the respective terminals or connectors 41 or 42.

According to an aspect of the invention a passive wireless sensor according to the first aspect of the invention comprises information on sensor functionality available in the specific wireless sensor tag. Such information may include, for example, sensor elements available (or a sensor node profile) in the sensor tag, calculations or procedures needed to make to get actual sensor values from the sensor elements, time needed to interrogate each of the sensor elements, a sensor element value range, information about scaling of the sensor element values, units of the sensor element values, calibration information, temperature compensation information, etc. Sensor node profile may be defined to indicate the types of sensor elements in the wireless sensor tag, and the wireless sensor tag may store a sensor node profile identifier in the memory 26. Thus, the amount of the backscattered sensor information may be reduced, and the reader may utilize the sensor node profile to obtain more specific information.

An aspect of the invention is a reader for a passive wireless sensor according to the other aspect of the invention. Generally, an RFID reader is a specialized radio transmitter and receiver. Like all such devices, the reader must generate signals at a carrier frequency fCW (e.g. around 800-950 MHz for typical UHF devices) and modulate this carrier signal to convey information to the tags. For passive tags, the reader may energize the tags with energy, receive the results and frequently handle the low-level anti-collision algorithms that allow the reader to read more than one tag at a time. In simple RFID systems, the reader's RF signal is a continuous wave (CW) signal or a pulsed on-off signal; in more sophisticated systems, the reader's RF signal can contain commands to the tag, instructions to read or write tag's memory. The reader 11 may selectively receive and amplify responses from the tags, and convert the signal from the carrier frequency down to the much lower frequencies characteristic of the information contained in the received signal.

Figure 4:
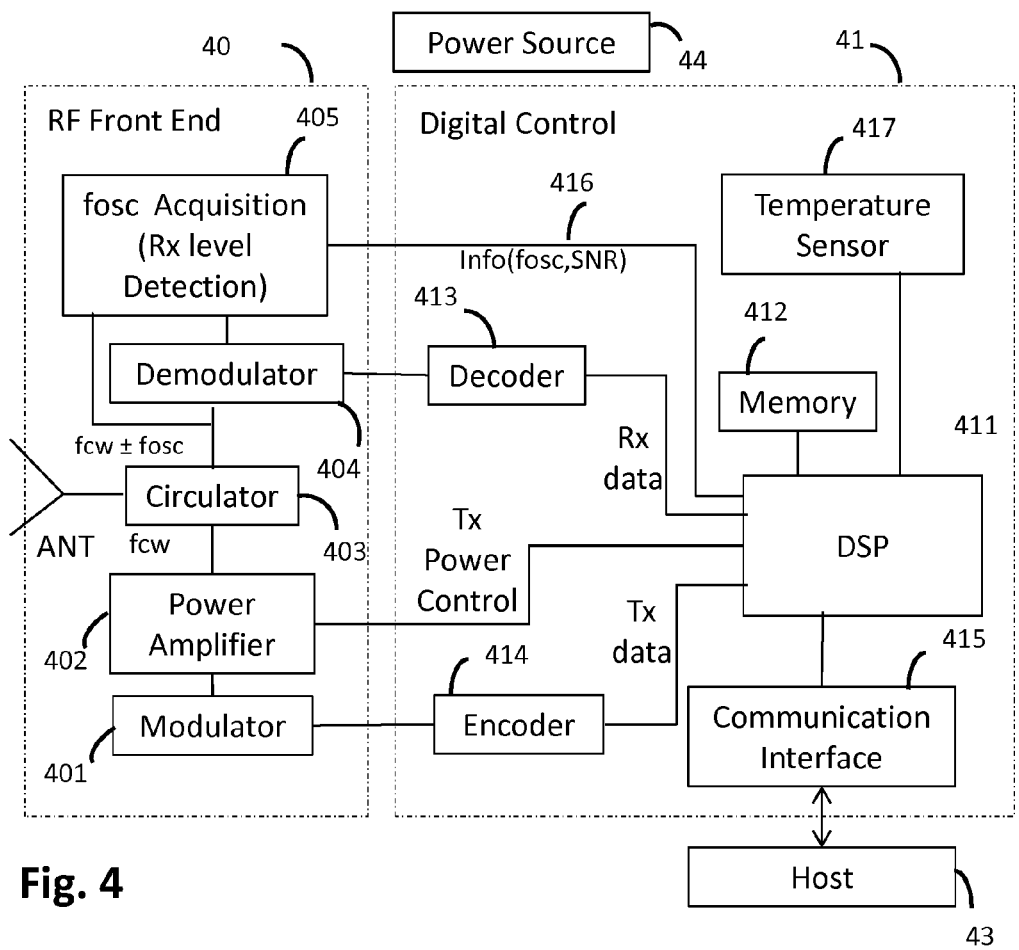
FIG. 4 is a functional block diagram illustrating an example of a an RFID reader architecture.

A general block diagram of an exemplary RFID reader is illustrated in FIG. 4. An RFID reader 11 may comprise two main sections: a radio frequency (RF) front end 40 and a digital control section 41. The radio frequency (RF) front end 40 is used for RF signal transmission and reception. The RF front end 40 may comprise two separate signal paths to correspond with the two directional data flows from and to the RFID sensor(s) 10. A modulator 401 may modulate a local oscillator signal (the RF carrier signal the signal fCW) with a Tx data (such as commands) from the digital control section 41, the modulated signal is amplified by the power amplifier 402, and the amplified signal, i.e. the RF power (effective isotropic radiated power, EIRP) and possible reader's command is transmitted via the antenna ANT to the sensor 10 which is situated within the reading zone or interrogation zone. The receiver receives the analog backscattered signals from the sensor 10 via the antenna ANT. A directional coupler or circulator 403 separates the amplified transmitted signal to the sensor 10 and the received weak back-scattered signal fcw±fosc from the sensor 10. The received backscattered signal is weak and low noise amplifiers may be provided to increase the received signal's amplitude before and after the signal is demodulated in a demodulator 404. The demodulator 404 may then send the demodulated received signal RX data to the digital control section 41. Different demodulation techniques may be used when demodulating the data received from the transponder or tag 10. Examples of modulation and demodulation techniques used in RFID systems include binary phase shift keying (BPSK) and amplitude shift keying (ASK). The radiation intensity of the reader antenna ANT determines the interrogation range and zone. Depending on the RFID system's applications the RFID reader can be designed in different ways where the antenna's resonating frequency, gain, directivity and radiation pattern can vary.

The control section 41 of the RFID reader 11 may perform digital signal processing and procedures over the received (Rx) data from the RFID tag. Also, the control section 41 may enable the reader to communicate with the RFID tags wirelessly by performing modulation, anti-collision procedures and decoding the received data from the RFID tags 10. This data is usually used to interrogate tags (read) or to reprogram the tag (write). The control section 41 (e.g. a microprocessor) may usually include a digital signal processing (DSP) block 410, a memory block 412, an encoder block 414, a decoder block 413, and a communication interface block 415. The control section 41 may receive the received demodulated signal from the RF front end 40, and convert it to an equivalent digital signal. The decoder 413 may then decode the received signal to Rx data and the DSP 411 may perform data processing for the Rx data. The memory block 412 may store various data, such as interrogated Rx data, the reader's configuration parameters, sensor-specific parameters etc. The encoder 413 of the control section 41 may encode a Tx data and output the encoded data to the RF front end 40 to modulate the carrier signal, when the control section 41 wants to send out a message or command to one particular tag or toward all of the tags 10 in the interrogation zone. Further, the control section 41 may control the RF transmission power of the RF front end 40, e.g. by controlling the gain of the power amplifier 402. All standard RFID digital communication may be received from wireless RFID sensors or tags 10 at carrier frequency fcw (using an appropriate modulation technique) and processed with the demodulator 404 and decoder 413. All common RFID functionality can be implemented with a commercial RFID reader, such as Mercury6e (M6e) embedded UHF RFID reader module from ThingMagic.

Figure 3A:
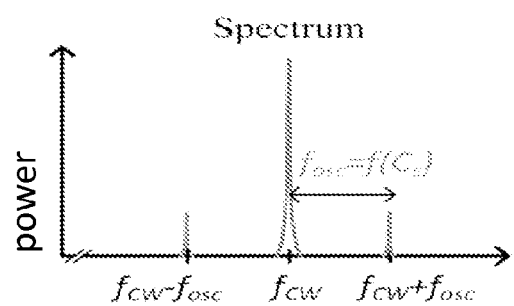
FIG. 3A is a spectral graph that illustrates the communication principle for an RFID sensor.

As discussed above, in a passive wireless sensor according to the first aspect of the invention the oscillation frequency fosc of the wireless sensor can be made dependent or sensitive on the measured quantity. In other words, the fosc is proportional to the sensed quantity at each specific moment. As also discussed above, the received back-scattered signal is modulated by the fosc, i.e. the received backscattered signal has a frequency fcw±fosc. The sidebands are offset from the carrier fcw by the oscillation frequency fosc, as illustrated in FIG. 3A.

According to an aspect of the invention the reader 11 may be arranged to detect the value of the sensed quantity based on the instantaneous oscillation frequency fOSC. Thus, no Access command or reading of the tag memory is needed for reading an actual sensor value. For example, a frequency fosc acquisition entity 405 may be provided to derive the fosc or a parameter representing it from the received backscattered signal. This information may be provided further to the control section 41 as illustrated by a signal 416. The entity 405 may optionally derive and provide further information regarding the received backscattered signal, such as a received signal level, a signal/noise ratio (SNR) of the received signal, etc. The fosc entity may, for example, comprise a down-mixer in which the received signal fcw±fosc is mixed with the carrier fcw so that an oscillation frequency signal fosc is obtained. The frequency $f_{offset}$ may then be measured with a suitable manner, e.g. with a frequency counting method. The fosc may also be detected directly from the received signal, e.g. by determining the frequency shift between fcw and fcw±fosc, the frequency shift being proportional to the oscillation frequency between fosc. The received signal level can be determined with any suitable signal level detector. Signal level information is already available in many commercial RFID readers.

In exemplary embodiments, the reader may also be provided with a temperature sensor element 417 to be used in temperature compensation of the received sensor values, as will be described in examples further below.

The communication interface enables the reader 11 to communicate with upper level systems, such as a host computer or a software application 43, using appropriate connections and appropriate protocols, such as OPC (OLE (object linking and embedding) for Process Control). For example, the reader may be physically connected to a host computer using a serial connection, such as the RS-228 or USB serial connection. As another example, the reader may be connected to the host computer 43 or a local server via a wired or wireless network, whereby the reader behaves like a standard network device and do not require particular knowledge of the hardware and system configuration. The RFID readers may support multiple network protocols such as Ethernet, TCP/IP, UDP/IP, HTTP, LAN, WLAN and others. The host 43 or server may generally serve two main functions. First, it is receiving data from the readers and performing data processing such as filtering and collation. Secondly, it serves as a device monitor, making sure the reader is functioning properly, securely and with up to date instructions. An RFID reader may further comprise a power supply 44. The power supply 44 may be an appropriate AC/DC adapter connected to a power network, or a battery power source, for example.

According to an aspect of the invention, the reader 11 is arranged to convert the sensor modulation frequency of a sensor tag response to a measurement value. It should be appreciated that the information of the received fosc or the parameter representing it typically is not sufficient as such, but the control section 11 may require further information about the RFID sensor in question. Typically, the reader must know the correlation between the modulation frequency and sensor values. The control section 41 may use the modulation frequency-sensor value correlation information to derive the actual value of the sensed quantity. The reader may further require information about, for example, calibration operations needed, calculations needed, sensor elements available in the sensor tag, time needed to interrogate each of the sensor elements, etc. The information to convert the sensor frequency modulation response to a measurement value may include, for example, a sensor range, information about scaling, units of measure, calibration information, temperature compensation information, etc. As used herein, all such information in any combination is referred to as frequency-sensor value correlation information.

It should be appreciated the adaptive reader according to embodiments of the invention may be implemented with an RFID reader having sufficient computation capacity, as illustrated by the example embodiments herein, or it may be implemented with an RFID reader connected to a remote or local computing device (such as a PC) that performs at least part of the computation required. The RFID may offer to the computing device special function interfaces which the computing device may call. For example, the reader may be a "dumb" device which provides RFID transceiver features and forwards modulation frequency information to another computing device that makes a conversion to a sensed value. All commands to a tag and the processing of the responses from the tag may be processed by the other computing device.

Examples of modulation frequency-sensor value correlation are illustrated in FIGS. 3B and 3C. In the example illustrated in FIG. 3B, the correlation curve +20° C. presents pressure values (mBar) of a pressure sensor in function of a modulation frequency fosc at temperature +20° C. (tag's operating temperature), when the nominal modulation frequency fosc is 256 kHz. Similar correlation curves are illustrated for temperatures −40° C., −20° C., +40° C., and +65° C., so as to demonstrate a possible temperature dependence of the frequency. In the illustrated example, sensed pressure values are mapped to the frequency range +2 . . . +25 kHz above the nominal fosc 256 kHz, i.e. to the range 258-281 kHz. It is also defined that the main operating level (pressure) sensed is between 990 mBar and 1010 mBar. In the example illustrated in FIG. 3C, the correlation curves present pressure values (mBar) of a gas sensor in function of a modulation frequency fosc, when the nominal modulation frequency fosc is 640 kHz. In the illustrated example, sensed pressure values are mapped to the frequency range +22 . . . +64 kHz above the nominal fosc 640 kHz, i.e. to the range 663-704 kHz. It is also defined that the main operating level (pressure) sensed is about 300 mBar. Exemplary sensor configuration information or frequency-sensor value correlation information that may be provided or stored for an RFID sensor tag having two sensors 1 and 2 is illustrated in FIG. 3D. The sensor 1 may be similar to that having correlation data illustrated in FIG. 3B, and the sensor 2 may be similar to that having correlation data illustrated in FIG. 3C. It should be appreciated that the sensor parameters and data as well as the data structures shown are non-limiting examples only.

Using a passive wireless sensor according to aspects of the invention and optionally a reader according to aspects of the invention, the reading distance of passive wireless sensors can be increased up to several meters, to a room scale. The increased reading distance makes it possible to read multiple passive wireless sensors (located within the increased reading range) with one and same reader. The multiple wireless sensors can have different types sensing elements, different reading cycles, different sensor value formats/ranges, different temperature compensation arrangements, different calibration arrangements, or other sensor-specific parameters, characteristics or configurations. There can also be several sensor elements with different configurations and parameters in a single passive wireless sensor. Although the UHF RFID technology (such as the standard Class-1 Gen-2 anti-collision), for example, has tackled most of the issues concerning reading of multiple wireless tags, there is a need to provide methods, routines and arrangements for managing and reading multiple passive wireless sensors having different sensor characteristics.

An aspect of the invention is a method and arrangement for managing and interrogating multiple passive wireless sensors having different sensor characteristics.

According to an aspect of the invention, frequency-sensor value correlation information may be stored in a non-volatile memory of an RFID sensor tag 10. For example, the frequency-sensor value correlation information may be stored in a memory location assigned for manufacture proprietary data in a memory of the RFID sensor tag, such as in the "Manufacturer record block" defined in ISO 18000-6C.

Figure 5:
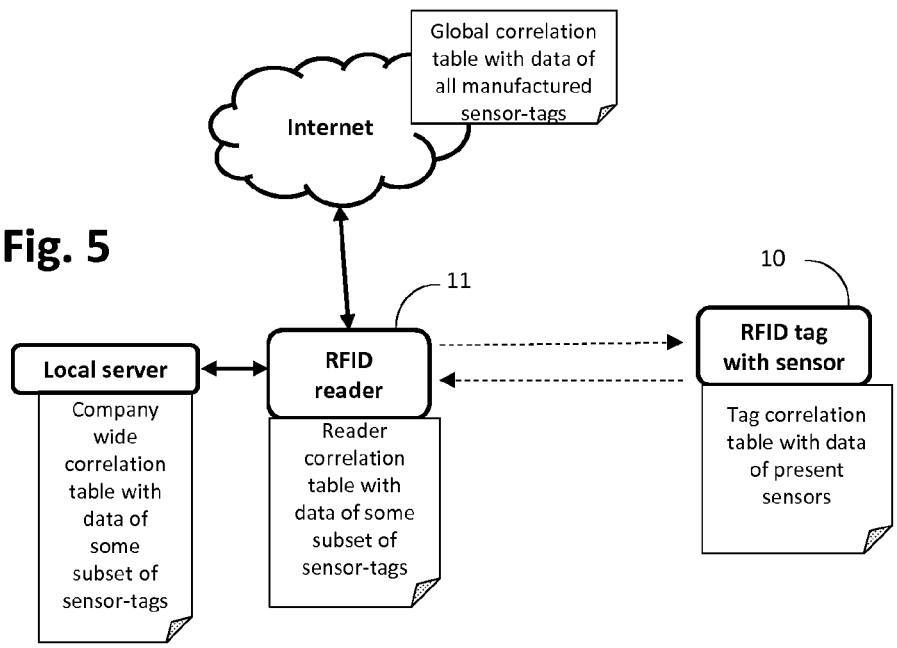
FIG. 5 illustrates an example of storing a frequency-sensor-value correlation table on several different locations.

According to an aspect of the invention, frequency-sensor value correlation information may be stored in location other than an RFID sensor tag, in addition to or instead of storage of the information in the RFID sensor tag. FIG. 5 illustrates an example of storing a frequency-sensor-value correlation table on several different locations. For example, frequency-sensor value correlation information may be stored in a reader 11, a host 43, on a local server that may be in use of many readers, and/or on a remote server, in a cloud or on Internet that may be in use of a plurality of readers globally. In an embodiment, correlation information stored in location other than an RFID sensor tag may be associated with a unique identifier of an RFID tag, such as the EPC, so that each individual RFID sensor tag can be distinguished. In an embodiment, correlation information stored in location other than an RFID sensor tag may be associated with a type of sensor.

According to an aspect of the invention, the frequency-sensor value correlation information may be stored in the reader during installation and configuration of the reader. The frequency-sensor value correlation information may not be usable for an RFID sensor tag before the tag or the type of sensor(s) is identified, e.g. a tag EPC is read. The reader may not have any information or any accurate information on the frequency-sensor value correlation of a specific RFID sensor tag prior to identifying the tag or the type of sensor.

According to an aspect of the invention, copy of the frequency-sensor value correlation information may be stored in the reader upon reading the correlation information from an RFID sensor tag. The frequency-sensor value correlation information may be read from a memory of an RFID sensor tag after the tag is identified, e.g. a tag EPC is read. The reader may not have any information or any accurate information on the frequency-sensor value correlation of a specific RFID sensor tag prior to reading the correlation information from the tag, According to an aspect of the invention, the reader 11 may retrieve copy of the frequency-sensor value correlation information from a location other than an RFID sensor tag, e.g. from a server, cloud or Internet. The reader may retrieve copy of the frequency-sensor value correlation information of a specific RFID sensor tag based on a unique identifier of the tag, such as the tag EPC. In an embodiment, the reader may retrieve copy of the frequency-sensor value correlation information based on knowledge of the types of sensor elements in RFID tags in the reading range. The frequency-sensor value correlation information may not be usable or retrievable for a specific RFID sensor tag before the tag or the type of sensor(s) is identified, e.g. a tag EPC is read. The reader may not have any information or any accurate information on the frequency-sensor value correlation of a specific RFID sensor tag prior to identifying the tag or the type of sensor.

According to an aspect of the invention, frequency-sensor value correlation information permanently stored in RFID sensor tags may be collected (copied) from the tags to readers, hosts 43, or servers so that when a specific RFID sensor tag is re-inventoried there may not be need to re-read the correlation information from the tag. The correlation information may be read from the tag and stored in the system only once, when the tag is first time inventoried in system locally or globally. After that the reader that finds a specific tag in a re-inventory may retrieve the correlation information from another location in the system. Thereby, signalling and data transferred over a radio interface is reduced which results in a faster operation and power savings. Moreover, the administration and management of the tags in the system will be automated.

An aspect of the invention is a method and arrangement for controlling and interrogating multiple passive wireless sensors having different sensor characteristics. On a general level, a SRFID reader handshake method is designed to provide easy handshaking of a SRFID reader 11 according to aspects of the invention and a passive wireless sensor 10 according to aspects of the invention. Each passive wireless SRFID sensor 10 can have multiple sensor elements 32, e.g. as illustrated above. Basically, the passive SRFID sensor nodes 10 are simply RFID tags with sensor elements attached. They become "clever" devices once some intelligence is attached to the handshake. Instead of just interrogating the passive RFID sensors and reading "dumb" sensor values, we can have a lot of information stored into the devices. This information may provide the methods for obtaining the actual measurement value. Moreover, we can use different ways to compensate temperature issues from the measurements.

Figure 6:
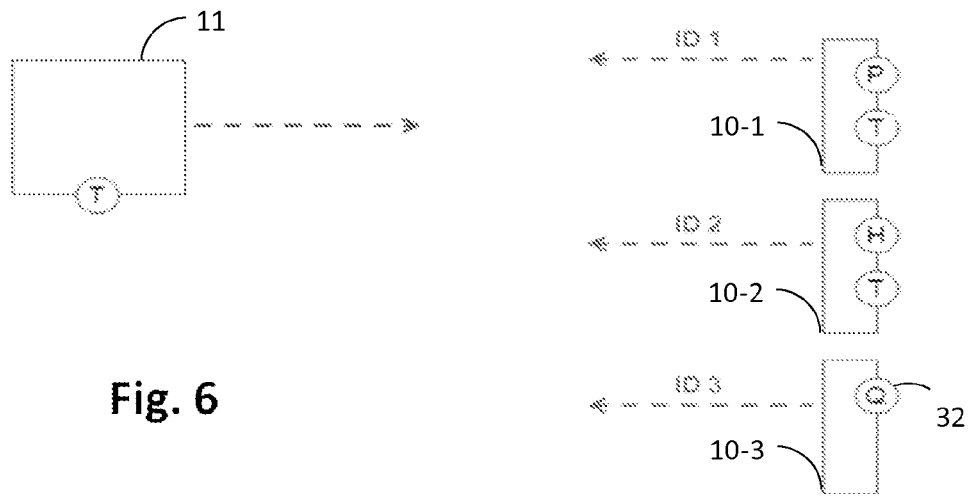
FIG. 6 a system diagram illustrating an example of a system with multi-sensor tags.

An example setup of reader 11 and three passive wireless sensors 10-1, 10-2 and 10-3 is illustrated in FIG. 6. Each passive wireless sensor 10-1, 10-2 and 10-3 can have one or multiple sensor elements 32. In the example setup, the first passive wireless sensor 10-1 comprises a pressure sensor element P and a temperature sensor element T; the second passive wireless sensor 10-2 comprises a humidity sensor element H and a temperature sensor element T; and the third passive wireless sensor 10-3 comprises only a single sensor element, a quality sensor Q. Typically the temperature sensor T may be used to compensate for a temperature-dependence of the other sensor element(s) or the resonator(s) in the respective wireless sensor 10, which temperature-dependence otherwise would falsify the measurement.

All communication between the tag 10 and reader 11 (also called the interrogator) occurs completely through a wireless link that is sometimes called an air interface. Through a sequence of commands sent and received between both devices (called the inventory round), an RFID reader 11 can identify the identifier code of an RFID tag, such as the electronic product code (EPC). For passive tags, the basic idea is that the reader initiates an inventory round with a query command. The query command essentially "wakes up" the tag, which responds with the appropriate information. According to the ISO 18000-6C standard (EPCglobal protocol Generation 2), RFID tags are designed to respond to predefined commands with predefined responses in a handshake manner, as is generally illustrated in FIG. 6. The RFID Q protocol (standard Class-1 Gen-2 Anti-collision)

protocol is defined for a tag contention control, e.g. to control how soon, and how often, a tag responds to a reader 11.

As soon as the tag 10 enters the RF field of the reader 11, it changes to the Ready state and accepts Select commands. Select commands are sent to all tags to inform each one if it is to take part in the Inventory process that is to follow. Multiple Select commands can be used to precisely define what tags are to respond. All exchanges between the reader 11 and tags 10 start with one or more Select commands. The tags do not respond to the Select command. Now, the Inventory group of commands can be used to initiate the singulation process, where each individual tag is identified and processed. Each inventory round starts with a Query command being broadcast—this command passes a Q-value (0 to 15) from what each tag 10 generates a slot counter number in the range (0, 2Q−1). Most readers dynamically adjust the Q-value depending on the number of tags in the field, thereby increasing the potential reading rate. If a tag generates a slot counter value of zero, it is allowed to reply by sending a 16-bit random number RN16 and at the same time transitioning to the Reply state. The other tags change state to Arbitrate and wait for. If the RN16 response from the tag 10 is successfully received, the reader replies by sending an ACK command, together with the same 16-bit random number. This response now allows the tag 10 to send back its tag ID, the Electronic Product Code (EPC), a 16-bit error check CRC16, along with some protocol control bits PC data, and change state to Acknowledged. The PC bits provide the length of the EPC stored in the tag, as well as some information pertaining to the numbering system and optionally the type of object to which the tag is attached (the application family identifier (AFI)).

If further actions need to be performed on a tag 10, and the tag 10 has returned its EPC number and is in the Acknowledged state, the reader 11 sends an Access command to transition the tag 10 to the Open (or Secured) state allowing operations such as Read, Write, Lock, and KILL. Read operation is used for reading single or multiple blocks of data from the memory of the tag 10. Write operation is used for writing single or multiple blocks of data to the memory of the tag 10.

Figure 7:
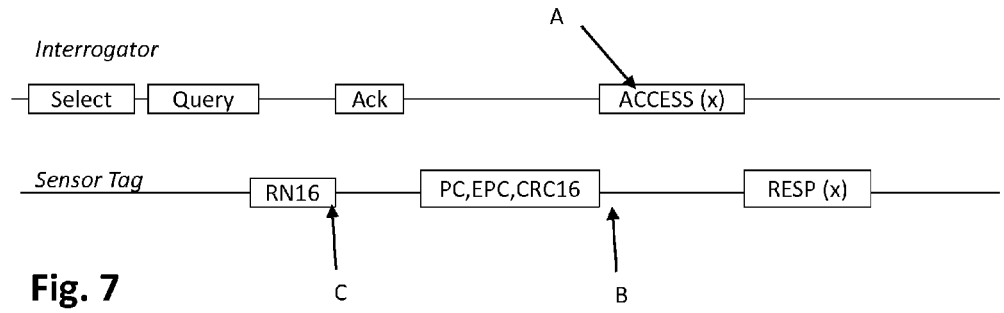
FIG. 7 is a signalling diagram illustrating examples of a procedure to make an inventory, to query frequency-sensor-value correlation data from a tag, and to read a sensed value.

According to an aspect of the invention, if the frequency correlation information is stored in the tag 10, and the frequency correlation information is not already collected from the tag 10 and/or not already stored in the reader 10 or on another location in the network (see FIG. 6), the reader 11 may query the correlation information with Access command (at point A in FIG. 7). This additional access may be made also to verify which sensor of a multi-sensor tag is currently used by the tag.

According to an aspect of the invention, if the frequency correlation information is not stored in the tag 10 but in the reader or on another location in the network, or the frequency correlation information is already collected from the tag 10 and already stored in the reader 10 or on another location in the network (see FIG. 6), once having received the (PC, EPC, CRC16) response (at point B in FIG. 7) the reader 11 may use the EPC to obtain the right correlation information for the tag 10. Thus, no Access command or reading of the tag memory may be required for this purpose.

The ISO 18000-6C standard defines that an RFID tag shall support 40-640 kHz modulation frequency range. This frequency has a tolerance of ±2.5% during backscatter. The allowed ±2.5% variation of the modulation frequency fosc may be too small frequency range for the purposes of transfer sensor values: sensor value range should be mapped to modulation frequencies within the allowed frequency tolerance range, e.g. sensor readings are modulated to 250 kHz±2.5%=241.75-256.25 kHz. The reader 11 may not be able to detect the frequency, and thereby the sensor value correctly with a sufficient resolution. For example, the exemplary modulation frequency-sensor value correlation illustrated in FIG. 3B would not be within this allowed frequency tolerance range.

However the base frequency tolerance allowed before backscatter is much higher. Depending on selected link frequency, i.e. the selected nominal modulation frequency, the tolerance can be: ±15% in 640 kHz, ±10% in 320 kHz, ±10% in 256 kHz, ±4% in 40 kHz. In other words, a tag 10 is allowed to response the RN16 with the modulation frequency of the higher tolerance, the reader 11 is locked to this modulation frequency, and the tags modulation frequency is allowed vary only ±2.5% from the locked modulation frequency during the remaining session.

According to an aspect of the invention, only one value for the modulation frequency and thereby the present sensor value of the tag may be obtained during one session with the sensor tag 11. The session with the tag is released before reading a new value for the same sensing element or another sensing element, so that the modulation frequency can change to correspond to the new sensed value.

For example, modulation frequency and thereby the present sensor value of the tag may be read already at the locking phase of the RFID reader, example from the RN16 reply (at point C in FIG. 7), or after frequency locking from the received the (PC, EPC, CRC16) response (at point B in FIG. 7). The modulation frequency and thereby the present sensor value of the tag may be made also later during the same session, e.g. at access point A in FIG. 7, but the modulation frequency and the sensed value is (should be) unchanged. The sensor value range is mapped to modulation frequencies within the allowed frequency tolerance range, e.g. sensor readings are modulated to 250 kHz±10%=225-275 kHz. Also the exemplary modulation frequency-sensor value correlation illustrated in FIG. 3B will fall within this allowed frequency tolerance range.

A tag 10 may be a multi-sensor tag that comprises two or more sensor. Multiple sensors in one tag 10 may require additional operations. When the reader 11 queries a multi-sensor tag 10, it may not know which one of the multiple sensors is modulating the backscattered signal of the tag. An additional access (point A in FIG. 7) may be made to verify which sensor of a multi-sensor tag is currently used by the tag. In an embodiment, it may be a default that a specific type of sensor, such the temperature compensation sensor or a reference sensor, is always the first one to response. According to an aspect of the invention, the reader 11 may send a command to activate specific sensors in a multi-sensor tag 10. In embodiments, the reader 11 may use Query command to activate specific sensors in a multi-sensor tag 10. For example, the ISO 18000-6C standard provides additional bits in a query command for activating tags with sensors. These bits can be used in our case to activate a specific sensor within tag 10. There are only 2 bits available so we can use this approach to activate maximum of 3 different sensors within a tag 10. This kind of approach requires a previous knowledge on which sensor will be activated by which bits, e.g. a predetermined 2-bit pattern is allocated to each sensor. This information may be stored in a reader or on some other location of the network for all available sensor-tags. In an embodiment, a predetermined bit pattern may be reserved for a specific type of default sensor, such as the temperature compensation sensor or a reference sensor. As another example, the ISO 18000-6C standard provides a HandleSensor which may carry any user commands, e.g. for activating tags with sensors.

Since the transmission of sensed value is based on tag-to-interrogator modulation frequency, we cannot change the modulation frequency during a normal session due to ±2.5% maximum variation allowed for the modulation. As a consequence, changing a sensor of the tag 10 and reading multiple sensors of the tag during the same session would likely cause larger variation of the modulation frequency than that allowed.

Figure 8A:
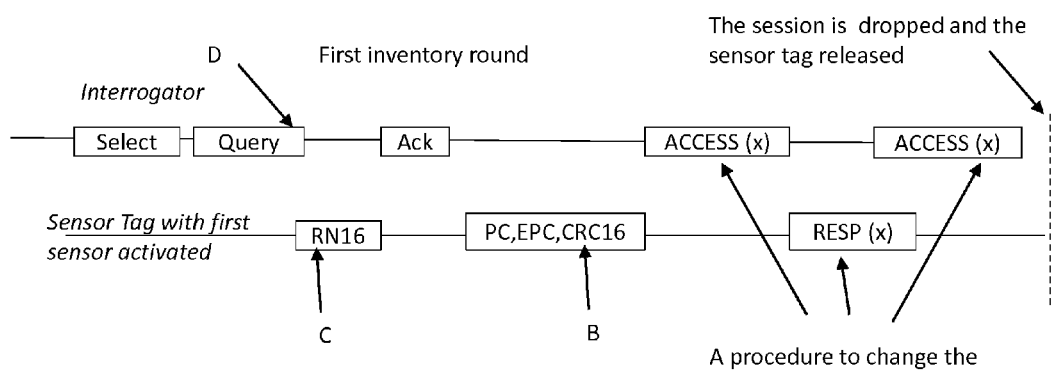
FIGS. 8A and 8B are signalling diagrams illustrating examples of a procedure to read an active sensor and to change an active sensor in the tag.
Figure 8B:
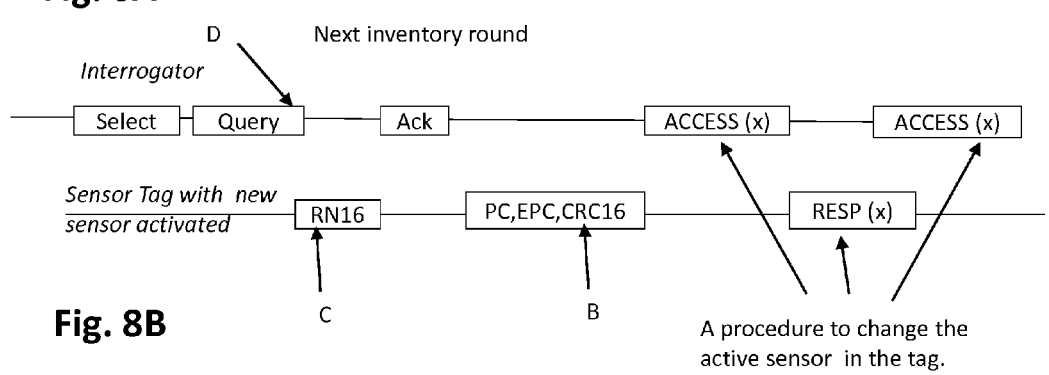

According to an aspect of the invention, a sensor of a multi-sensor tag 10 is changed during previous read-out cycle and then the tag is released (the session is ended) for a moment for to be re-found with a new modulation frequency fosc dependent on the new sensor. In other words, a new sensor for the next inventory round or query may be pre-selected during a present inventory round or query performed with a presently active sensor, as illustrated in the example shown in FIGS. 8A and 8B.

The actual procedure to change the sensor or oscillator is not important. An activation or interrogation command from the reader 11 may directly access a memory location or register that controls a selection and activation of a desired sensor-element, e.g. a control register of the sensor selector 39 shown in FIGS. 2B and 2C (with a Write command, for example). As another example, a command from the reader may command the RFID logic 26 to make the necessary activation operations. For example, the HandleSensor command may be used for commanding the tag 10. The tag 10 may configured to operate such that the next time a new inventory occurs the new sensor is part of the oscillator. For example, the change of the oscillator may be immediate which probably causes more than ±2.5% change in the modulation frequency and thus allows the reader to drop the session. As another example, the change of the sensor is postponed to occur after the sensor changes to a ready or arbitrate state.

An aspect of the invention is the temperature compensation of the sensor measurements in order to cancel the effect of the temperature in the value of the sensed quantity. In the example of FIG. 7 the sensor tags 10-1 and 10-2 are provided with a temperature sensor T for temperature compensation purposes. The temperature sensing capability may be provided with a reference resonator, such as the reference resonator 31-ref illustrated in FIGS. 2C and 2D, and/or with its associated temperature sensor.

According to an aspect of the invention, in case of a sensor tag having an integrated temperature sensing capability, the tag may also be provided with an internal temperature compensation which compensates the temperature dependence of the oscillator.

According to an aspect of the invention, in case of a sensor tag having an integrated temperature sensing capability (in addition to the actual sensor element e.g. pressure sensor), the temperature value may be interrogated first, since it used in the conversion of the actual sensor value in the reader 11.

According to an aspect of the invention, the reader 11 may comprise a temperature sensor element for temperature compensation purposes, such as the temperature sensor 417 shown in FIG. 4. The temperature sensing in the reader 11 instead of implementing temperature sensing in the sensor tag will result in savings in size and cost of the sensor tag. It also makes temperature compensation available for all types of sensor tags. If the sensor tag has an integrated temperature sensing capability, the reader 11 may ignore its own temperature measurements, or the temperature values may be compared with the temperature values interrogated from the sensor tag, for example to verify validity of the interrogated temperature values.

An aspect of the invention is a calibration of the sensor tag 10 by the reader 11. The reader 11 may interrogate measurement values of a sensor element 32 in the sensor tag 10 multiple times while the actual correct value is known, e.g. from a reference measurement. The actual measured quantity may be changed during the calibration so that measurement values would be stored for several different measurements. The correlation or error between the interrogated values and the known actual values may be determined and calibration parameters may be defined to correct the interrogated values. The calibration parameters may be stored within the reader 11 and/or forwarded up to some host 43 or server. The calibration of the sensor tag 11 may always require the aid of reader 11.

According to an aspect of the invention, the calibration information is also stored in the sensor tag. This allows a sensor tag roaming from the range of one reader 11 to the range of another reader. The calibration information may be queried during the handshake by the new reader 11, and the new reader may not need to repeat the calibration procedure already carried out by the previous reader.

According to an aspect of the invention, a sensor tag 10 may provide a pre-processed value as a sensor value. For example, a sensor tag 10 may provide as a sensor value an indication whether a specific criterion is met in the measure quantity. For example, a sensor tag having a gas leakage sensor element may give only an on/off indication of a monitored surrounding gas. This kind of on/off signal can reach longer distance than a signal with accurate measurement values. The reader 11 may query or set the trigger criterion or limit value during the handshake.

It will be obvious to a person skilled in the art that the inventive concept can be implemented in various obvious alternative ways. The invention and its embodiments are not limited to the examples described above but may vary within the scope of the claims.

The invention claimed is:

1. A method for reading a passive radio frequency identification (RFID) sensor tag, comprising
   an RFID reader sequentially carries out inventory rounds with at least one passive sensor tag having at least one sensing element arranged to sense a predetermined quantity,
   the passive RFID sensor tag comprising two or more sensing elements having different sensor characteristics,
   RFID reader reads a value of a predetermined quantity of one of the sensing elements of the passive RFID sensor tag based on a backscattering modulation frequency used by the passive RFID sensor tag during one inventory round and releases the RFID sensor tag prior to reading a value of a predetermined quantity of another one of the sensing elements of the passive RFID sensor tag based on a backscattering modulation frequency used by the passive RFID sensor tag during a subsequent inventory round.

2. A method according to claim 1, comprising
   the RFID reader preselects a sensing element for the next inventory round during a present inventory round carried out with a presently selected sensing element.

3. A method as claimed in claim 2, wherein the preselecting of a sensing element for the next inventory round comprises sending a query signal with a sensor activation command to the passive RFID sensor tag during the present inventory round carried out with the presently selected sensing element, the sensor activation command defining which one of the sensing elements is activated in the passive RFID sensor tag.

4. A method as claimed in claim 3, wherein the sensor activation command comprises predetermined bits or bit patterns in the RFID query signal.

5. A method as claimed in claim 3, wherein the sensor activation command is configured to control a sensor selector in the passive RFID tag.

6. A method as claimed in claim 2, wherein the preselecting of a sensing element for the next inventory round during a present inventory round carried out with a presently selected sensing element comprises the RFID reader accessing a memory location or a register that controls a selection and activation of the sensing elements in the passive RFID sensor tag, preferably controlling a sensor selector in the passive RFID sensor tag.

7. A method according to claim 1, wherein using a default sensing element in the passive RFID sensor tag until a selection of a sensing element is made by the RFID reader, such as during a first inventory round.

8. A method according to claim 7, wherein the default sensing element comprises a sensing element or a resonator with known temperature dependence, and wherein the RFID reader reads the temperature of the passive RFID sensor tag based on the backscattering modulation frequency of the passive RFID sensor tag having the default sensing element activated, and the RFID reader uses the read temperature to cancel the effect of the temperature variation from the backscattering modulation frequency of the passive RFID sensor tag when other than the default sensing element is activated.

9. A method according to claim 1, wherein the RFID reader reads multiple passive RFID sensor tags during one inventory round.

10. An RFID reader, wherein
the RFID reader is structured to communicate with at least one passive RFID sensor tag with a backscattering principle,
the RFID reader is configured to sequentially carry out inventory rounds with at least one passive sensor tag comprising two or more sensing element arranged to sense predetermined quantities and having different sensor characteristics,
the RFID reader is configured to read a value of a predetermined quantity of one of the sensing elements of the passive RFID sensor tag based on a backscattering modulation frequency used by the passive RFID sensor tag during one inventory round,
the RFID reader is configured to release the RFID sensor tag prior to reading a value of a predetermined quantity of another one of the sensing elements of the passive RFID sensor tag based on a backscattering modulation frequency used by the passive RFID sensor tag during a subsequent inventory round.

11. A RFID sensor system, comprising
a plurality of passive RFID sensor tags
an RFID reader structured to communicate with said plurality of passive RFID sensor tag with a backscattering principle,
at least one of said plurality of passive RFID sensor tags comprising two or more sensing elements for sensing predetermined quantities and having and having different sensor characteristics, a backscattering modulation frequency of the passive RFID sensor tags being dependent on a value of a quantity sensed by each respective sensing element,
the RFID reader is configured to sequentially carry out inventory rounds with said least one passive sensor tag comprising the two or more sensing elements,
the RFID reader is configured to read a value of a predetermined quantity of one of the sensing elements of said at least one passive RFID sensor tag based on a backscattering modulation frequency used by the at least one passive RFID sensor tag during one inventory round,
the RFID reader is configured to release the at least one RFID sensor tag prior to reading a value of a predetermined quantity of another one of the sensing elements of the at least passive RFID sensor tag based on a backscattering modulation frequency used by the passive RFID sensor tag during a subsequent inventory round.

* * * * *